(12) United States Patent
Zhang et al.

(10) Patent No.: US 12,538,631 B2
(45) Date of Patent: Jan. 27, 2026

(54) METHOD FOR MANUFACTURING COLOR MICRO LED DISPLAY CHIP MODULE

(71) Applicant: Fujian Prima Optoelectronics Co., Ltd., Fujian (CN)

(72) Inventors: Fan Zhang, Fujian (CN); Yongsheng Wu, Fujian (CN); Jiapeng Qi, Fujian (CN)

(73) Assignee: Fujian Prima Optoelectronics Co., Ltd., Fuzhou (CN)

( * ) Notice: Subject to any disclaimer, the term of this patent is extended or adjusted under 35 U.S.C. 154(b) by 446 days.

(21) Appl. No.: 18/176,451

(22) Filed: Feb. 28, 2023

(65) Prior Publication Data

US 2023/0246060 A1 Aug. 3, 2023

Related U.S. Application Data

(63) Continuation of application No. PCT/CN2022/077020, filed on Feb. 21, 2022.

(30) Foreign Application Priority Data

Jan. 28, 2022 (CN) .......................... 202210104851.5

(51) Int. Cl.
*H10H 29/14* (2025.01)
*H01L 23/00* (2006.01)
*H01L 25/065* (2023.01)

(52) U.S. Cl.
CPC ........... *H10H 29/142* (2025.01); *H01L 24/29* (2013.01); *H01L 24/83* (2013.01);
(Continued)

(58) Field of Classification Search
CPC ............... H10H 20/856; H10H 29/142; H10H 20/8514; H10H 20/018; H10H 20/01;
(Continued)

(56) References Cited

U.S. PATENT DOCUMENTS

| | | | |
|---|---|---|---|
| 2013/0187178 A1* | 7/2013 | Tischler | H10F 77/496 257/88 |
| 2014/0008667 A1* | 1/2014 | Lau | H10D 86/60 257/77 |

(Continued)

FOREIGN PATENT DOCUMENTS

| | | |
|---|---|---|
| CN | 108510895 A | 9/2018 |
| CN | 109979960 A | 7/2019 |

(Continued)

*Primary Examiner* — Mouloucoulaye Inoussa

(57) ABSTRACT

The present disclosure discloses a method for manufacturing a color Micro LED display chip module, comprising preparing a Micro LED chip on a substrate, grinding and cutting the chip and then flip-bonding same on a driving basal plate, and peeling the substrate from the chip. Through fabricating a quantum dot hole site corresponding to a sub-pixel unit position of a chip on a transparent basal plate and filling a quantum dot light-color converter in the quantum dot hole site and depositing a quantum dot protective layer, a conversion device is fabricated independently on the transparent basal plate. Compared with processing a conversion layer on a substrate layer in the prior art, inverting a full-color quantum dot conversion device and then aligning and bonding same with the integrated monochrome Micro LED module base can improve the fabrication efficiency, eliminate the crosstalk between light and color in full-color Micro LED display.

6 Claims, 4 Drawing Sheets

(52) U.S. Cl.
CPC .......... *H01L 25/0655* (2013.01); *H01L 24/32* (2013.01); *H01L 2224/29023* (2013.01); *H01L 2224/32238* (2013.01); *H01L 2224/83801* (2013.01)

(58) Field of Classification Search
CPC ............. H10H 20/0361; H10H 20/812; H10H 20/835; H10H 20/831; H10H 20/818; H10H 20/833; H10H 20/824; H10H 20/851; H01L 24/83; H01L 24/29; H01L 25/0655; H01L 25/167; H01L 24/32; H01L 25/0753; H01L 21/6835; H01L 2224/29023; H01L 2224/32238; H01L 2224/83801; H01L 2221/68354; H01L 2221/68368; G02B 6/12007; G02B 6/105; G02B 6/124; G02B 6/12004; G02B 6/12002; G02B 6/131; G02B 6/1225; G09G 3/32; G09G 2300/0842
See application file for complete search history.

(56) References Cited

U.S. PATENT DOCUMENTS

| | | | | |
|---|---|---|---|---|
| 2018/0308420 A1* | 10/2018 | Shin | ...................... | H04N 25/76 |
| 2020/0343230 A1* | 10/2020 | Sizov | ...................... | H01L 25/18 |
| 2022/0102583 A1* | 3/2022 | Baumheinrich | ... | G02B 6/12007 |
| 2022/0352277 A1* | 11/2022 | Kim | ...................... | H10K 71/00 |

FOREIGN PATENT DOCUMENTS

| | | | |
|---|---|---|---|
| CN | 110998879 A | 4/2020 | |
| CN | 113540177 A | 10/2021 | |

* cited by examiner

METHOD FOR MANUFACTURING COLOR MICRO LED DISPLAY CHIP MODULE

CROSS REFERENCE TO RELATED APPLICATIONS

The present application is a Continuation Application of PCT Application No. PCT/CN2022/077020 filed on Feb. 21, 2022, which claims the benefit of Chinese Patent Application No. 202210104851.5 filed on Jan. 28, 2022. All the above are hereby incorporated by reference in their entirety.

TECHNICAL FIELD

The present disclosure relates to the field of semiconductor technology, and in particular to a method for manufacturing a color Micro LED display chip module.

BACKGROUND ART

There are two options for the existing full-color Micro LED display. The first is that RGB transfers a large number of individual RGB LED chips into the same substrate. The second is based on monochromatic Micro LED, using quantum dots for conversion on its chip.

However, in the existing full-color display solutions, the efficiency of the first transfer mode is not improved all the time, and the size of a single pixel is limited by the transfer device. The second mode, based on monochromatic Micro LED combined with quantum dots, often suffers from substrate lift-off and color crosstalk problems.

SUMMARY OF THE INVENTION

The technical problem to be solved by the present disclosure is as follows. A method for manufacturing a color Micro LED display chip module is provided, which can solve the problems of substrate peeling difficulty and light-color crosstalk.

In order to solve the above-mentioned technical problem, the technical solution adopted by the present disclosure is as follows.

A method for manufacturing a color Micro LED display chip module comprises the steps of:
preparing a Micro LED chip on a substrate, grinding and cutting the chip and then flip-bonding same on a driving basal plate, and peeling the substrate from the chip to obtain an integrated monochromatic Micro LED module base;
fabricating a quantum dot hole site corresponding to a position of a sub-pixel unit of the Micro LED chip on a transparent basal plate, filling a quantum dot light-color converter in the quantum dot hole site and depositing a quantum dot protective layer, and successively preparing a metal reflective layer and a metal spacer layer at positions between the quantum dot hole sites above the quantum dot protective layer to obtain a full-color quantum dot conversion device; and
inverting the full-color quantum dot conversion device and then aligning and bonding same with the integrated monochromatic Micro LED module base to obtain a color Micro LED display chip module.

The advantageous effect of the present disclosure is that, by preparing a Micro LED chip on a substrate, grinding and cutting the chip, then flip-bonding same on a driving basal plate, and peeling the substrate from the chip, compared with peeling the chip wafer from the whole surface in the prior art, the peeling is less difficult and has a high yield. By fabricating a quantum dot hole site corresponding to a position of the sub-pixel unit of a chip on the transparent basal plate, filling a quantum dot light-color converter in the quantum dot hole site and depositing a quantum dot protective layer, a conversion device is fabricated independently on the transparent basal plate. compared with processing a conversion layer on a substrate layer in the prior art, inverting a full-color quantum dot conversion device and then aligning and bonding same with the integrated monochrome Micro LED module base can improve the fabrication efficiency. In addition, the conversion device uses the combination structure of quantum dots-quantum dot protective layer-metal reflective layer-metal isolating layer, which can improve the light intensity and eliminate light-color crosstalk in full-color Micro LED display.

Figure 1:
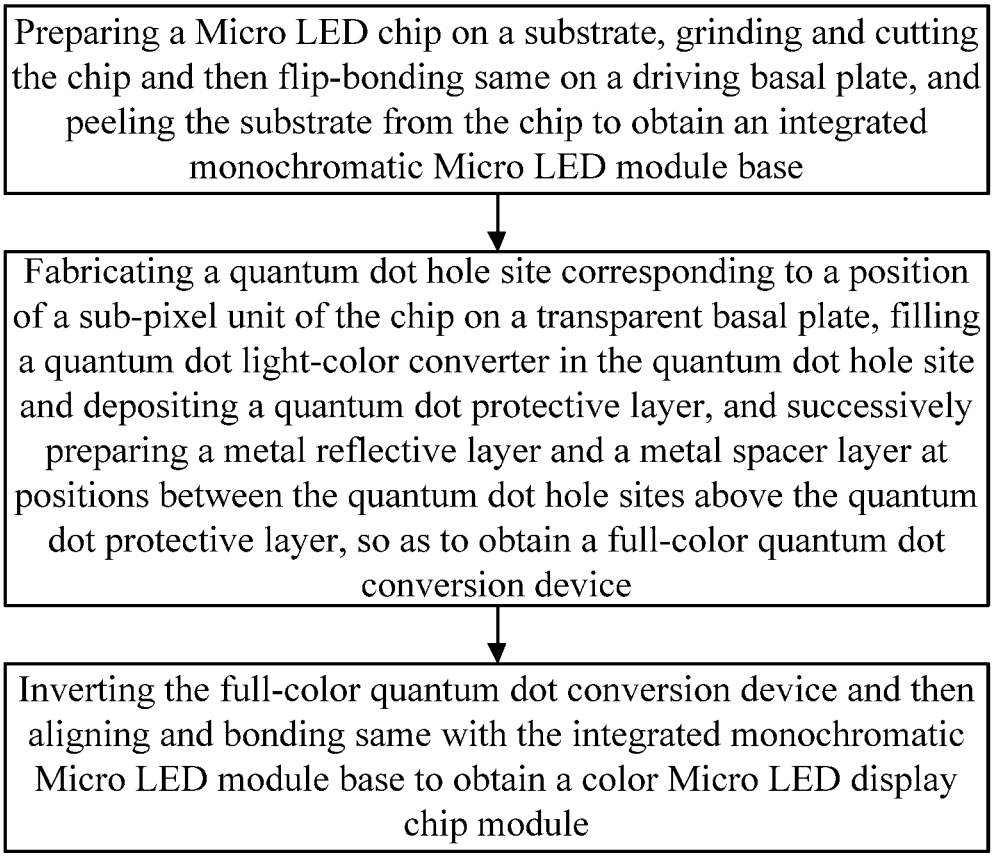
FIG. 1 is a flowchart illustrating a method for manufacturing a color Micro LED display chip module according to an embodiment of the present disclosure.

REFERENCE NUMERALS 1, substrate; 2, single sub-pixel unit of the gallium nitride integrated chip; 3, sub-pixel pad; 4, pixel composed of 2*2 sub-pixel units; 5, driving basal plate; 6, welding material; 7, integrated monochromatic Micro LED module base; 8, transparent adhesive; 9, intermediate insulation covering layer; 10, metal spacer layer; 11, metal reflective layer; 12, quantum dot protective layer; 13, green quantum dot light-color converter; 14, transparent basal plate; 15, red quantum dot light-color converter; 16, light blocking layer; 17, quantum dots.

DETAILED DESCRIPTION OF THE INVENTION

In order to explain the technical contents, the objects, and the effects of the present disclosure in detail, the embodiments will be described below with reference to the accompanying drawings.

Figure 2:
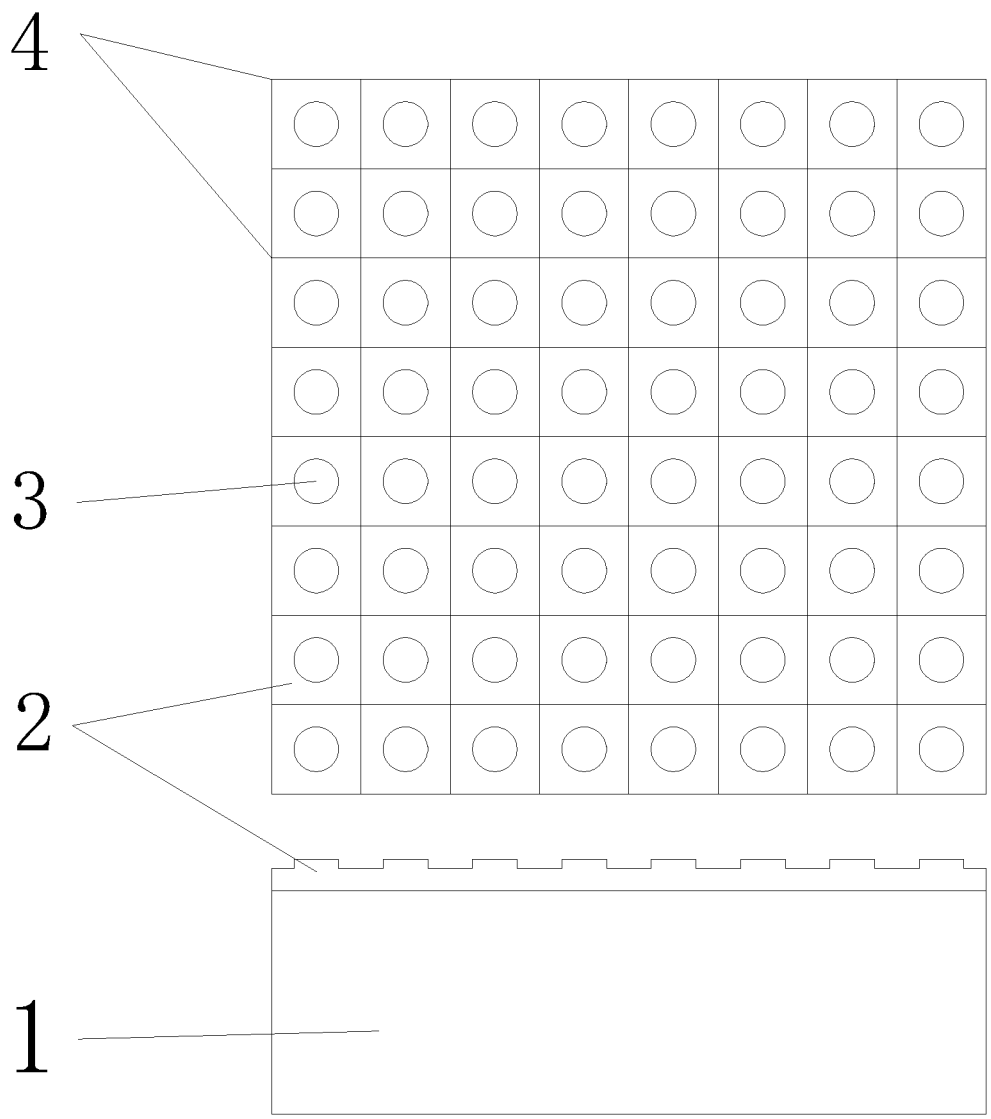
FIG. 2 is a schematic diagram of a structure of an integrated GaN-based monochrome Micro LED chip.
Figure 3:
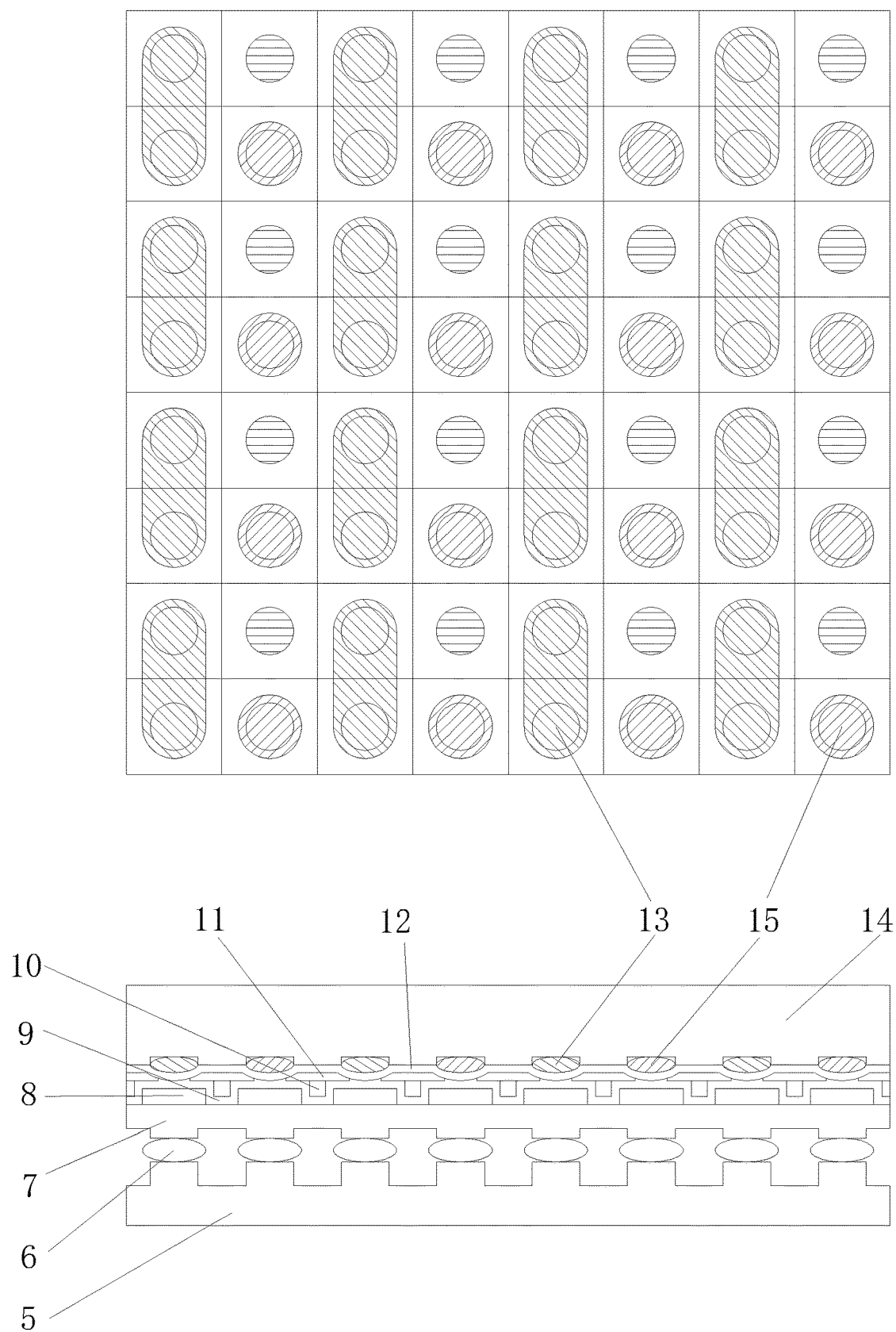
FIG. 3 is a schematic diagram of a color Micro LED display chip module structure.

With reference to FIGS. 1 to 3, an embodiment of the present disclosure provides a method for manufacturing a color Micro LED display chip module, comprising the steps of:
preparing a Micro LED chip on a substrate 1, grinding and cutting the chip and then flip-bonding same on a driving basal plate 5, and peeling the substrate from the chip to obtain an integrated monochromatic Micro LED module base 7;
fabricating a quantum dot hole site corresponding to a position of a sub-pixel unit of the chip on a transparent basal plate 14, filling a quantum dot light-color converter in the quantum dot hole site and depositing a quantum dot protective layer 12, and successively preparing a metal reflective layer 11 and a metal spacer layer 10 at positions between the quantum dot hole sites above the quantum dot protective layer 12 to obtain a full-color quantum dot conversion device;

inverting the full-color quantum dot conversion device and then aligning and bonding same with the integrated monochrome Micro LED module base 7 to obtain a color Micro LED display chip module.

As apparent from the foregoing description, the present disclosure has an advantageous effect that, by preparing a Micro LED chip on the substrate 1, grinding and cutting the chip, then flip-bonding same on the driving basal plate 5, and performing substrate peeling on the chip, compared with performing full-face peeling on a chip wafer in the prior art, the peeling is less difficult and has a high yield. By fabricating a quantum dot hole site corresponding to the position of the sub-pixel unit of the chip on the transparent basal plate 14, filling a quantum dot light-color converter in the quantum dot hole site and depositing a quantum dot protective layer 12, a conversion device is fabricated independently on the transparent basal plate 14. Compared with processing a conversion layer on a substrate layer in the prior art, inverting a full-color quantum dot conversion device and then aligning and bonding same with the integrated monochrome Micro LED module base 7 can improve the fabrication efficiency. In addition, the conversion device uses a combination structure of quantum dots 17-quantum dot protective layer 12-metal reflective layer-metal isolating layer, and can improve the light intensity and eliminate the light-color crosstalk in a full-color Micro LED display.

Further, the preparing a Micro LED chip on a substrate 1 comprises the following steps.

A gallium nitride-based epitaxial layer is grown on the substrate, and a single sub-pixel unit 2 and a sub-pixel pad 3 of the gallium nitride integrated chip are fabricated on the basis of the gallium nitride-based epitaxial layer.

It can be seen from the foregoing description that fabricating the single sub-pixel unit and the sub-pixel pad 3 of the chip on the basis of a gallium nitride-based epitaxial layer facilitates subsequent soldering of the chip and a driving device on the basis of the sub-pixel pad 3.

Further, the preparing a Micro LED chip on a substrate further comprises:
  taking four sub-pixel units arranged in a matrix in the Micro LED chip as one pixel, wherein the color ratio of sub-pixels in the pixel is blue:red:green=1:1:2.

It can be seen from the foregoing description that four matrix-arranged sub-pixel units are taken as one pixel and the ratio of sub-pixel colors is blue:red:green=1:1:2 for subsequent color Micro LED.

Further, grinding and cutting the chip and then flip-bonding same on a driving basal plate 5 comprises:
  grinding and cutting the chip and flipping the ground and cut chip; and
  bonding a predetermined pad interface of the flip chip to the driving basal plate by a welding material 6.

It can be seen from the foregoing description that the chip is cut and welded on the driving basal plate so as to facilitate subsequent substrate peeling, and therefore the subsequent substrate peeling process is simple and has a high yield, and removing the substrate can effectively eliminate the phenomenon of optical crosstalk and improve the overall display effect of the display chip.

Further, the fabricating a quantum dot hole site corresponding to a position of a sub-pixel unit of the Micro LED chip on a transparent basal plate 14 comprises:
  using photolithography to make a pattern corresponding to the position of the sub-pixel unit of the chip on the transparent basal plate, and obtaining the quantum dot hole site by etching.

It can be seen from the foregoing description that the quantum dot hole site corresponding to the position of the sub-pixel unit of the chip is etched on a transparent basal plate, which can correspond to an integrated base chip pixel, and a luminescent excitation quantum dot 17 of the integrated base chip is used.

Further, filling a quantum dot light-color converter in the quantum dot hole site and depositing a quantum dot protective layer comprises:
  spin coating the quantum dot light-color converter of remaining two colors of the three primary colors except a first color in the quantum dot hole site according to the color ratio of the sub-pixel, wherein the first color is a color of the epitaxial layer of the Micro LED chip;
  removing excess quantum dot light-color converter using a developing solution; and
  depositing an aluminum oxide quantum dot protective layer over the quantum dot light-color converter using atomic layer deposition.

It can be seen from the foregoing description that it is possible to improve the lifetime of quantum dots by depositing an aluminum oxide quantum dot protective layer using an atomic layer deposition method after fabricating quantum dots on the transparent basal plate.

Further, successively preparing a metal reflective layer 11 and a metal spacer layer 10 at positions between quantum dot hole sites above the quantum dot protective layer comprises:
  covering a metal reflective layer 11 on the quantum dot protective layer, and opening the metal reflective layer 11 at a position of a centre the quantum dot hole site;
  preparing the metal spacer layer 10 above the metal reflective layer 11 at positions between the hole sites of the quantum dots.

It can be seen from the foregoing description that the protective layer of the quantum dots is covered with the metal reflective layer 11, the reflective layer has an opening at the centre of the quantum dots, the quantum dots are excited by light emission in the hole through the substrate chip, and the metal reflective layer is outside the hole to isolate crosstalk. Making a metal isolating layer on the metal reflective layer can further prevent side crosstalk.

Further, successively preparing a metal reflective layer and a metal spacer layer 10 at positions between quantum dot hole sites above the quantum dot protective layer comprises:
  uniformly covering an intermediate insulation covering layer 9 above the metal reflective layer and the metal spacer layer 10;
  filling a transparent adhesive 8 in a recess of the intermediate insulation covering layer 9.

It can be seen from the foregoing description that the intermediate insulation covering layer 9 is deposited on the metal reflective layer and the metal isolating layer, and this layer can both protect the metal and prevent the metal from causing a short circuit of the integrated substrate chip.

Further, inverting the full-color quantum dot conversion device and aligning and bonding same with the integrated monochrome Micro LED module base comprises the following steps.

The full-color quantum dot conversion device is inverted, and the position where the full-color quantum dot conversion device is coated with the transparent adhesive 8, is aligned and bonded with the sub-pixel unit of the integrated monochrome Micro LED module base.

It can be seen from the foregoing description that the transparent insulating adhesive is used to connect the light-color conversion layer and the part which leaks out after the integrated base chip is peeled off the substrate, and therefore the conversion device and the chip module are prepared independently, which can improve the processing yield of the conversion device and the manufacturing yield of the module chip.

The above-mentioned method for manufacturing a color Micro LED display chip module of the present disclosure is applicable to improving the light intensity, eliminating light-color crosstalk, improving the insulation capability of a module, improving the heat dissipation capability of a module and improving the lifetime of a quantum dot 17 in a full-color Micro LED display, and the following is explained by means of specific embodiments:

Embodiment 1

With reference to FIGS. 1 to 3, a method for manufacturing a color Micro LED display chip module comprises the following steps.

S1, a Micro LED chip is prepared on a substrate, the chip is ground and cut and then flip-bonded on a driving basal plate, and the substrate is peeled from the chip to obtain an integrated monochromatic Micro LED module base.

S11, a gallium nitride-based epitaxial layer is grown on the substrate, and a single sub-pixel unit 2 and a sub-pixel pad of a gallium nitride integrated chip are fabricated on the basis of the gallium nitride-based epitaxial layer.

Specifically, in this embodiment, an integrated GaN-based monochrome Micro LED chip includes a substrate, individual sub-pixels and sub-pixel bonding pads of a gallium nitride (GaN) integrated chip.

Four sub-pixel units arranged in a matrix in the Micro LED chip are taken as one pixel, and the color ratio of sub-pixels in the pixel is blue:red:green=1:1:2.

Specifically, a pixel 4 composed of a substrate, a single sub-pixel of a GaN integrated chip fabricated on the basis of a GaN epitaxial layer, a pad on the sub-pixel, and a preset 2*2 total of 4 sub-pixel units can constitute a monochrome base of a full-color pixel.

In this embodiment, after the chip is prepared on the substrate, an arrangement of 1 blue, 1 red and 2 green is reserved for one pixel according to 4 units. Chip grinding and cutting processing is performed.

S12, after the chip is ground and cut, the ground and cut chip is inverted, and a pre-set pad interface of the inverted chip is combined with a driving basal plate via a welding material 6, so as to obtain an integrated monochromatic Micro LED module base.

Specifically, after the chip is prepared, it is flip-bonded to the driving basal plate, and the chip is bonded to the driving basal plate through a reserved pad interface and a welding material 6. The individual chips are then subjected to a substrate peeling on the basal plate so that they expose the GaN. The resulting product is referred to as an integrated monochrome Micro LED module base.

In order to eliminate the crosstalk problem, the substrate layer of the chip must be peeled, but the existing wafer peeling methods require too much flatness of the wafer, and the laser peeling process yield is low. In this embodiment, a single display chip peeling method is used to solve the problem of peeling the whole wafer.

S2, a quantum dot hole site corresponding to a position of the sub-pixel unit of the chip is fabricated on a transparent basal plate, a quantum dot light-color converter is filled in the quantum dot hole site and a quantum dot protective layer is deposited, and a metal reflective layer and a metal spacer layer 10 are successively prepared at positions between the quantum dot hole sites above the quantum dot protective layer to obtain a full-color quantum dot conversion device.

S21, photolithography is used to make a pattern corresponding to the sub-pixel unit position of the chip on the transparent basal plate, and the quantum dot hole site is obtained by etching.

Specifically, in the aspect of light-color conversion, a scheme of preparing a quantum dot conversion layer on the GaN surface after chip peeling is designed, wherein the preparation of the quantum dot conversion layer is a separate process, and a transparent basal plate 14 such as glass, acrylic and a polymer film is used to prepare quantum dot hole sites on the substrate.

S22, according to the color ratio of the sub-pixel, spin coating is performed on the quantum dot light-color converter of remaining two colors of the three primary colors except a first color in the quantum dot hole site, wherein the first color is a color of the epitaxial layer of the Micro LED chip; excess quantum dot light-color converter is removed using a developing solution; an aluminum oxide quantum dot protective layer is deposited over the quantum dot light-color converter using atomic layer deposition.

In this embodiment, the light-color converter may be a quantum dot glue or a small particle phosphor, and the color of the epitaxial layer of the Micro LED chip is blue. Quantum dot hole sites of a red quantum dot light-color converter 15 and a green quantum dot light-color converter 13 are prepared on a basal plate according to a pre-set 2*2 zone, wherein these quantum dot light-color converters use blue or near-blue excitation, and the excitation wavelength range is 450-475 nm.

Specifically, red and green quantum dots are prepared in sequence. A red quantum dot glue is spin-coated according to the hole site, patterning is performed using an exposure method, unwanted quantum dots are removed using a developing solution, and an aluminium oxide protective layer is deposited using an atomic layer deposition method (ALD). Then, according to the hole site, the green quantum dot glue is spin-coated, the pattern is made by exposure method, the unwanted quantum dots are removed by developing solution, and the aluminum oxide protective layer is deposited by ALD method.

S23, a metal reflective layer is covered on the quantum dot protective layer, and the metal reflective layer is opened at a position of a centre of the quantum dot hole site.

Specifically, in this embodiment, a metal reflective layer is prepared by using a metal having reflectivity, such as aluminium and platinum. The above-mentioned quantum dot protective layer is covered, and the metal reflective layer is opened at the position of the centre of the quantum dot hole, wherein the quantum dots are excited by emitting light through the base chip in the hole, and the metal reflective layer is outside the hole to insulating crosstalk. Namely, the metal reflective layer serves the functions of enhancing the light output intensity and isolating the optical crosstalk.

S24, a metal spacer layer is prepared above the metal reflective layer at positions between quantum dot hole sites.

Specifically, a metal spacer layer is formed on the metal reflective layer at positions between quantum dots, and the metal spacer layer functions to prevent optical crosstalk.

S25, an intermediate insulation covering layer is uniformly covered over the metal reflective layer and the metal spacer layer; a recess of the intermediate insulation cover is filled with a transparent adhesive 8.

In particular, an intermediate insulation covering layer is prepared on the above-mentioned chip, and the material may be silicon oxide or aluminum oxide. The recess of the intermediate insulation covering layer is filled with a transparent insulating adhesive for connection with the chip after peeling of the substrate. The resulting product is referred to as a full-color quantum dot conversion device.

S3, the full-color quantum dot conversion device is inverted and then aligned and bonded with the integrated monochrome Micro LED module base to obtain a color Micro LED display chip module.

The prepared full-color quantum dot conversion device is inverted and connected to the GaN reserved surface of the integrated monochrome Micro LED module base, and the positioning of the connection is based on that the blue through hole coated with transparent adhesive left on the full-color quantum dot conversion device is aligned with the position of the blue reserved electrode at the sub-pixel unit of the integrated monochrome Micro LED module base. The transparent adhesive of the light-color conversion module is combined with the GaN surface of the integrated GaN-based monochromatic Micro LED chip after the substrate is peeled off and dried to obtain a color Micro LED display chip module.

Figure 4:
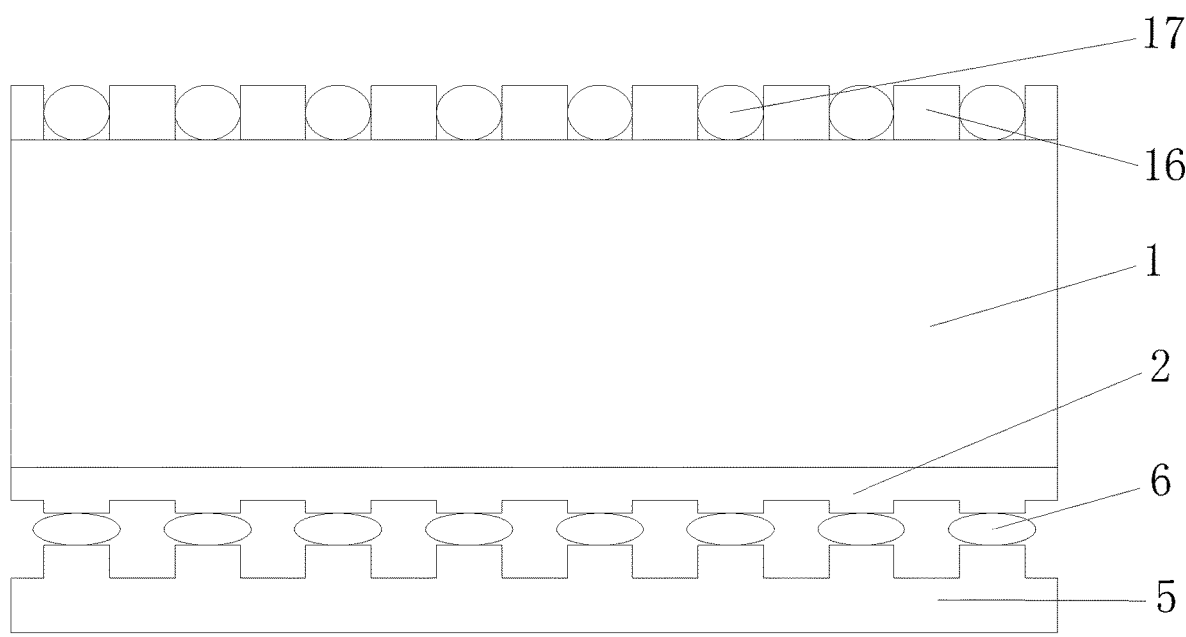
FIG. 4 is a schematic diagram of a conventional full-color integrated Micro LED conversion structure.

With reference to FIG. 4, compared with a conventional full-color integrated Micro LED conversion structure, in the present embodiment, the substrate is removed, and there is no need to prepare a light-insulating layer 16 on the substrate, and the removal method is firstly cutting the chip, then welding same on the driving basal plate, and then peeling the substrate; A new structure of light-color conversion module is designed, which is separately processed outside the chip and then combined to the chip, and is not processed based on the substrate layer of the chip. In addition, the light-color conversion module of the present embodiment uses a combined structure of quantum dots-protective layer-reflective layer-isolating layer-insulating layer, so as to improve the light intensity when displaying a full-color Micro LED, eliminate light-color crosstalk, improve the insulation capability of the module, improve the heat dissipation capability of the module and improve the lifetime of the quantum dot.

Embodiment 2

This embodiment differs from embodiment 1 in that a specific application scenario is provided.

In step 1, a GaN-based epitaxial wafer grown on a sapphire substrate by a MOCVD (metal organic compound chemical vapour deposition) device is used as a base, a photolithography machine and a photolithography facility such as a photoresist are used, pattern transfer is performed on materials according to a designed chip pattern, and an integrated Micro LED chip wafer is fabricated by processes such as etching an N-type layer on the surface of the GaN, a conductive layer is evaporated, an insulating layer is deposited, and a metal electrode is evaporated, etc.

In step 2, the wafer is ground, polished and cut to form an integrated Micro LED chip, as shown in FIG. 2.

In step 3, the above-mentioned chip is welded to the driving basal plate via a welding material, the welding surface of the chip is a chip electrode, and after welding, the electrode surface of the chip is below and combined with the driving basal plate, and the substrate surface is above.

In step 4, a laser is used to peel the substrate of the chip on the substrate surface of the chip of the above-mentioned combination. The driving basal plate, welding material, and integrated monochrome Micro LED module base appear after processing is complete and have been assembled together. After peeling the GaN faces up as shown in FIG. 3.

In step 5, photolithography is used to make a pattern on the transparent basal plate, and ICP is used to perform etching so as to make the positions of the quantum dots.

In step 6, according to the designed full-color pixel position, namely, the position of the quantum dots in FIG. 3, photolithography is used to prepare red quantum dots, and ALD is used to make a protective layer on the surface thereof.

In step 7, green quantum dots are prepared using photolithography according to the designed full-color pixel positions, i.e. the positions of the quantum dots in FIG. 3, and a protective layer is fabricated on the surface thereof using ALD.

In step 8, a metal reflective layer is fabricated: the quantum dot protective layer is first coated with glue and performed with photolithography, and then a metal aluminum-copper alloy is evaporated by means of metal evaporation, followed by metal peeling, leaving the metal aluminum-copper alloy at a predetermined position. This layer is metal-free at the central position of the quantum dot, i.e. transparent, and metal at other positions. The metal forms reflection at the surface of the quantum dot to enhance the light output intensity of the quantum dot, and isolates other light rays at the layer without the quantum dot to avoid optical crosstalk.

In step 9, a metal isolating layer is fabricated on the metal reflective layer; sizing and photolithography are performed, and then a metal aluminum-copper alloy is evaporated by means of metal evaporation, followed by metal peeling, leaving the metal aluminum-copper alloy at a predetermined position. The metal remaining in this layer serves primarily to prevent optical crosstalk between pixels, acting as a light blocking wall.

In step 10, an intermediate insulation covering layer is successively deposited on the above-mentioned fabricated metal isolating layer; alumina is deposited using ALD as the material for the covering layer.

In step 11, a transparent adhesive is sprayed on the recess at the position of the quantum dot prepared above.

In step 12, the surface sprayed with the adhesive in step 11 is combined with the GaN surface which is exposed after the chip prepared in step 4 is peeled off, and the combined whole is a color Micro LED display chip module.

In summary, the present disclosure provides preparing a Micro LED chip on a substrate, grinding and cutting the chip and then flip-bonding same on a driving basal plate, and peeling the substrate from the chip. Therefore, compared with peeling a chip wafer from the whole surface in the prior art, the difficulty in peeling is low and the yield is high, wherein four matrix-arranged sub-pixel units in the chip serve as one pixel and the ratio of sub-pixel colors is blue:red:green=1:1:2, resulting in an integrated monochrome Micro LED module base. By fabricating a quantum dot hole site corresponding to a position of the sub-pixel unit of a chip on a transparent basal plate, filling a quantum dot light-color converter in the quantum dot hole site and depositing a quantum dot protective layer, a conversion device is fabricated independently on the transparent basal plate. Compared with processing a conversion layer on a substrate layer in the prior art, the fabrication efficiency can be improved. The conversion device uses a combination structure of quantum dots-a quantum dot protective layer-metal reflective layer-metal isolating layer-intermediate insulation covering layer, which can improve the light intensity when a full-color Micro LED displays, eliminate the light-color crosstalk, protect the metal and prevent the metal from causing a short circuit of the integrated substrate chip. A transparent insulating adhesive is used to connect the light-color conversion layer with a part which is exposed after the substrate is peeled off the integrated base chip, and therefore the conversion device and the chip module are prepared independently, which can improve the processing yield of the conversion device and the manufacturing yield of the module chip.

While the foregoing is directed to embodiments of the present disclosure without limitation on the scope of patent of the present application, it is intended that all equivalency made on basis of the claims and drawings of the present application, directly or indirectly used in the relevant technical field, are likewise included in the scope of patent protection of the present application.

What is claimed is:

1. A method for manufacturing a color Micro LED display chip module, comprising the steps of:
    preparing a Micro LED chip on a substrate, grinding and cutting the Micro LED chip and then flip-bonding same on a driving basal plate, and peeling the substrate from the Micro LED chip to obtain an integrated monochromatic Micro LED module base;
    fabricating a quantum dot hole site corresponding to a position of a sub-pixel unit of the Micro LED chip on a transparent basal plate, filling a quantum dot light-color converter in the quantum dot hole site and depositing a quantum dot protective layer, and successively preparing a metal reflective layer and a metal spacer layer at positions between the quantum dot hole sites above the quantum dot protective layer to obtain a full-color quantum dot conversion device;
    inverting the full-color quantum dot conversion device and then aligning and bonding same with the integrated monochromatic Micro LED module base to obtain a color Micro LED display chip module;
    successively preparing a metal reflective layer and a metal spacer layer at positions between the quantum dot hole sites above the quantum dot protective layer comprising:
        covering the metal reflective layer on the quantum dot protective layer, and opening the metal reflective layer at a position of centre of the quantum dot hole site;
        preparing the metal spacer layer at a position between quantum dot hole sites above the metal reflective layer;
    after successively preparing a metal reflective layer and a metal spacer layer at positions between the quantum dot hole sites above the quantum dot protective layer, the method further comprising:
        uniformly covering an intermediate insulation covering layer over the metal reflective layer and the metal spacer layer;
        filling a transparent adhesive in a recess of the intermediate insulation covering layer such that the full-color quantum dot conversion device is obtained;
    inverting the full-color quantum dot conversion device and then aligning and bonding same with the integrated monochromatic Micro LED module base comprising:
        inverting the full-color quantum dot conversion device, and aligning and bonding a position, coated with the transparent adhesive, of the full-color quantum dot conversion device with a sub-pixel unit of the integrated monochromatic Micro LED module base.

2. The method for manufacturing a color Micro LED display chip module according to claim 1, wherein the preparing a Micro LED chip on a substrate comprises:
    growing a gallium nitride-based epitaxial layer on the substrate, and fabricating a single sub-pixel unit and a sub-pixel pad of a gallium nitride integrated chip on the basis of the gallium nitride-based epitaxial layer.

3. The method for manufacturing a color Micro LED display chip module according to claim 1, wherein the preparing a Micro LED chip on a substrate further comprises:
    taking four sub-pixel units arranged in a matrix in the Micro LED chip as one pixel, a color ratio of the sub-pixels in the pixel being blue:red:green=1:1:2.

4. The method for manufacturing a color Micro LED display chip module according to claim 1, characterized in that grinding and cutting the Micro LED chip and then flip-bonding same on a driving basal plate comprises:
    after grinding and cutting the Micro LED chip, flipping the ground and cut Micro LED chip; and
    bonding a predetermined pad interface of the flip chip to the driving basal plate by a welding material.

5. The method for manufacturing a color Micro LED display chip module according to claim 1, characterized in that the fabricating a quantum dot hole site corresponding to a position of a sub-pixel unit of the Micro LED chip on a transparent basal plate comprises:
    using photolithography to make a pattern corresponding to the position of the sub-pixel unit of the Micro LED chip on the transparent basal plate, and obtaining the quantum dot hole site by etching.

6. The method for manufacturing a color Micro LED display chip module according to claim 3, characterized in that filling a quantum dot light-color converter in the quantum dot hole site and depositing a quantum dot protective layer comprises:
    spin coating a quantum dot light-color converter of remaining two colors of the three primary colors except a first color in the quantum dot hole site according to the color ratio of the sub-pixel, the first color being a color of the epitaxial layer of the Micro LED chip;
    removing excess quantum dot light-color converter using a developing solution; and
    depositing an aluminum oxide quantum dot protective layer over the quantum dot light-color converter using atomic layer deposition.

* * * * *